United States Patent [19]

Hobbins

[11] Patent Number: 4,922,382
[45] Date of Patent: May 1, 1990

[54] LINE PROTECTION DEVICE

[75] Inventor: Kenneth A. W. Hobbins, Grantham, England

[73] Assignee: Rainford Racks Limited, St. Helenes, England

[21] Appl. No.: 242,202

[22] Filed: Sep. 9, 1988

[30] Foreign Application Priority Data

Sep. 12, 1987 [GB] United Kingdom ............... 8721496

[51] Int. Cl.$^5$ .............................................. H05K 9/00
[52] U.S. Cl. ................................. 361/424; 174/35 R;
174/35 C; 174/35 GC; 361/394; 361/395;
361/399; 439/610
[58] Field of Search ............. 174/35 R, 35 C, 35 GC;
361/111, 119, 390-395, 399, 424; 439/607, 609,
610, 544, 95

[56] References Cited

U.S. PATENT DOCUMENTS 3,311,792  3/1967  Scoville .............................. 361/424
4,685,034  8/1987  Tetsu et al. ........................ 361/399

FOREIGN PATENT DOCUMENTS 3533419  3/1987  Fed. Rep. of Germany ...... 361/399

Primary Examiner—Gregory D. Thompson
Attorney, Agent, or Firm—Staas & Halsey

[57] ABSTRACT

A line protection device for signal and control lines accessing a telecommunications, data communications and/or distributed computer system comprises a modular unit which includes input and output sockets and one or more two-stage protection circuits housed within an electromagnetically shielded enclosure in the form of a metal box. Each two-stage protection circuit comprises a transient/surge part and a suppression part. The modular units are adapted to be fitted into signal lines leading to equipment cabinets or vaults at positions externally of such equipment cabinets or vaults so as to remove unwanted pulses in the signal lines upstream of the cabinets and to shield the signal lines against further introduction of unwanted pulses prior to entry of the signal lines into the cabinets.

2 Claims, 6 Drawing Sheets

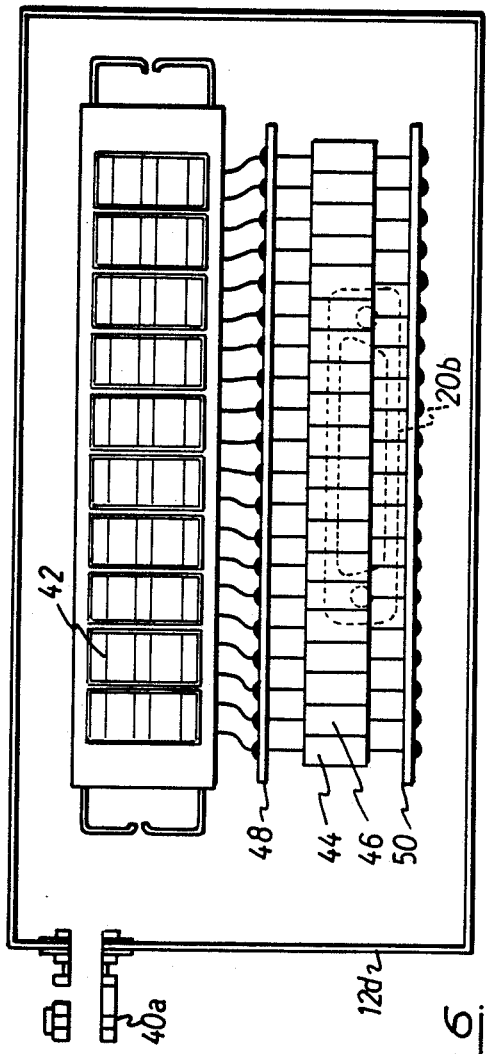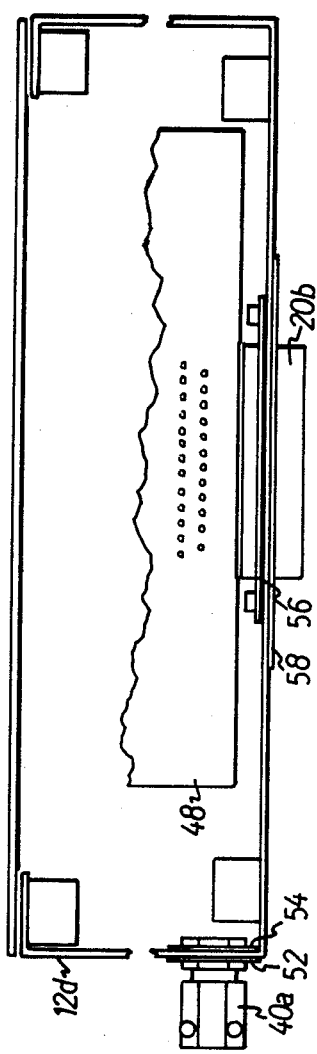
Fig 6.
Fig 7.

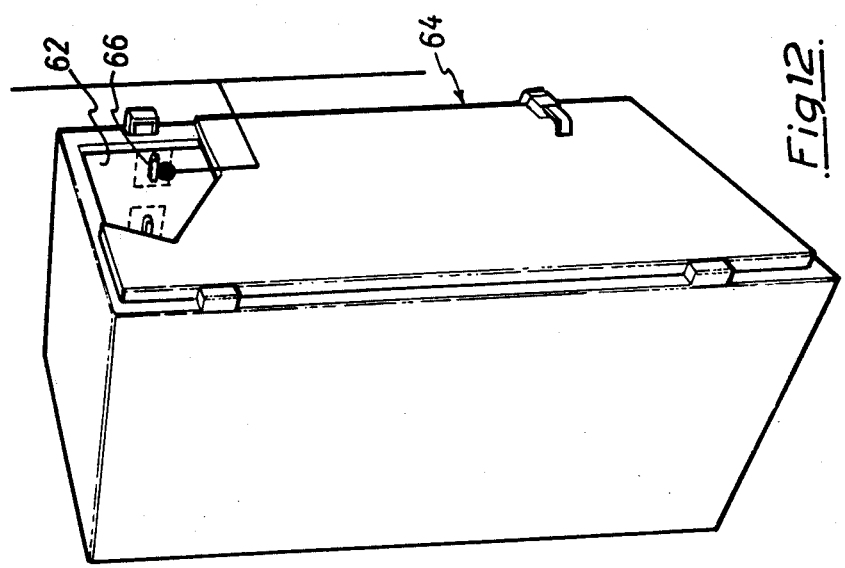
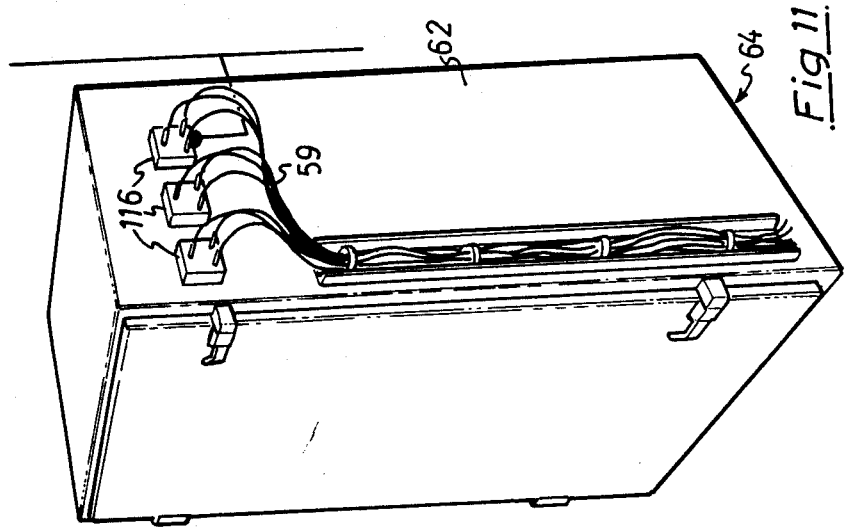

LINE PROTECTION DEVICE

BACKGROUND OF THE INVENTION

The present invention relates to a line protection device and in particular, but not exclusively, to a protection device for signal and control data lines accessing a telecommunications, data communications and/or distributed computer system.

DESCRIPTION OF THE RELATED ART

Electromagnetic pulses, such as those caused by a lightening strike, give rise to an electromagnetic field which induces voltages in metal objects. The energy transferred from this field damages or destroys sensitive electronic equipment, particularly the sensitive solid state input circuits to communications, data communications and/or distributed computer equipment.

Such sensitive devices must be protected against the radiated electromagnetic field and also against the large voltages which may be induced in the connecting cables and conductors which lead to and from the equipment. Line protection devices are employed to protect the sensitive electronic equipment from this latter source of damage and interference.

Since there is no single device that can react fast enough or absorb the large amount of energy induced in the lines, present line protection is typically performed in two stages. The first stage is a transient protection device or spark gap which has a relatively slow reaction time but will absorb a large amount of energy and the second stage suppression circuit is a voltage dependent resistor or diode which has a relatively fast reaction time but will only absorb a small amount of energy. The two stages are separated by a delaying device, since if the two stages were connected directly across the line being protected the second stage would operate before the first stage, and would be damaged or destroyed by the high energy level in the electromagnetic pulse.

Present line protection devices are housed within separate shielded protection vaults within screened equipment cabinets, which leads to disadvantages with respect to high costs and inefficient usage of space. Also, when it becomes necessary to replace or repair any line protection devices, which may be a time consuming process, the electromagnetic screening of devices not requiring repair or replacement is impaired. Similarly, the functional quality of installed, repaired or replaced protection devices is not consistent since this factor depends on the skill and consistency of the person installing or repairing the protection device. Communication equipment also commonly includes a large number of channels or lines and present protection devices comprise a large number of unnecessarily long, untidy and loose wires that lead to internal interference problems.

SUMMARY OF THE INVENTION

An object of the present invention is to provide a compact line protection device which eliminates the need for separate shielded protection vaults within screened equipment cabinets, is easily removed and replaced by another device, of consistent functional quality, without negating the electromagnetic screening or shielding of other protected lines accessing the screened enclosure and which allows for individual screened connection to be maintained separately and shielded through the protection process and until the line connection accesses its destination equipment.

Another object of the present invention is to provide a line protection device which protects any optional number of lines. As such, it is desired that the device may be readily fitted to a telecommunications system in order to satisfy the protection requirements of the number of lines already connected and any lines which may be added as a result of future modifications.

In accordance with the present invention there is provided a line protection device which comprises a modular unit including input and output sockets and at least one two stage protection circuit housed therein, all housed in an electromagnetically shielded enclosure to protect against radiated interference.

Preferably, the input socket of the modular protection device comprises at least one screen trap and the output socket of the device comprises at least one multi-way screened connector.

The modular unit advantageously comprises a metal or metallised box and some surfaces thereof also may include an electromagnetic interference gasket. Each modular protection device preferably includes up to twenty two-stage protection circuits which are accessed via the screen trap and exit via the multi-way connector. As such, the plurality of protection circuits are compactly mounted on a circuit board which is itself compactly housed within the metal or metallised box.

In a preferred embodiment, the lines access and exit the box from different sides thereof, such that the circuit board is located substantially in between the input and output sockets. The transient protection devices, delay circuits and second state suppression devices are preferably mounted on the circuit board such that the plurality of two-stage protection devices are in a uniform parallel arrangement. The input socket is advantageously located approximate to the transient protection devices and the multi-way screened output socket is advantageously located approximate to the second stage suppression devices. The modular device is therefore provided as a compact unit with a minimum of loose wires. The device is constructed remote from the equipment it is to be connected to and a consistently high quality of manufacture is maintained. Any faulty protection device may simply be replaced by another modular unit without the need to access and repair any equipment on site.

BRIEF DESCRIPTION OF THE DRAWINGS

The invention is described further hereinafter, by way of example only, with reference to the accompanying drawings, in which:

FIGS. 6 and 7 are part sectional, part schematic plan and side views of a third embodiment;

FIGS. 11 and 12 illustrate how the embodiment of FIGS. 9 and 10 can be used in practice.

DETAILED DESCRIPTION OF THE PREFERRED EMBODIMENTS

Figure 1:
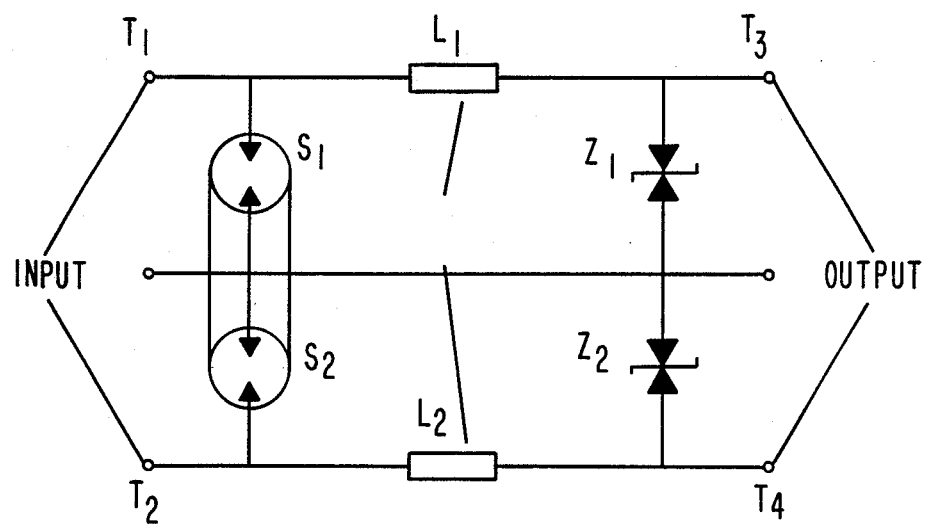
FIG. 1 is an electrical circuit diagram of a two-stage line protection device.

FIG. 1 shows the electrical circuit of a single line protection device. This includes the series connection of a pair of spark gaps $S_1$, $S_2$, constituting a first stage transient protection device and connected across a pair of input terminations $T_1$, $T_2$. Connected in parallel with the spark gaps $S_1$, $S_2$, via respective delay devices in the form of chokes $L_1$, $L_2$, is the series connection of a pair of zener diodes $Z_1$, $Z_2$ (or varistors) constituting a second stage suppression circuits. The output is taken across the zenor diodes at output terminations $T_3$, $T_4$. The junction between the spark gaps and the junction between the zeners is connected to a common reference potential, usually ground.

Figure 2:
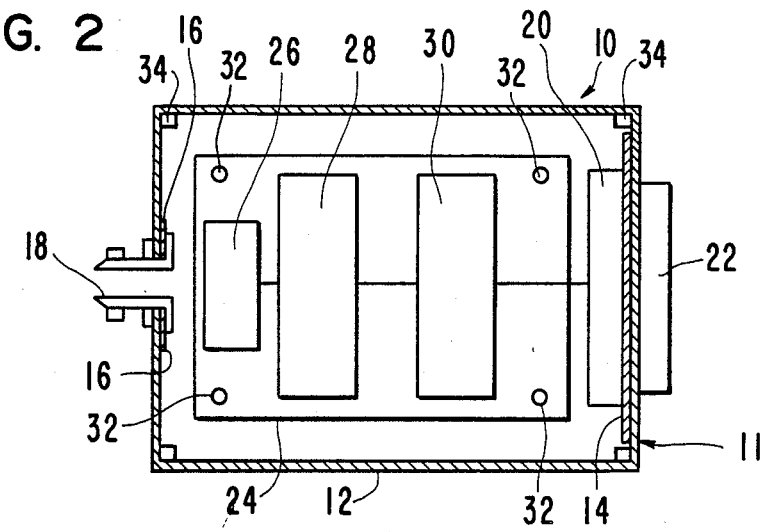
FIG. 2 is a part sectional, part schematic view of one embodiment of a modular line protection device in accordance with the present invention.
Figure 3:
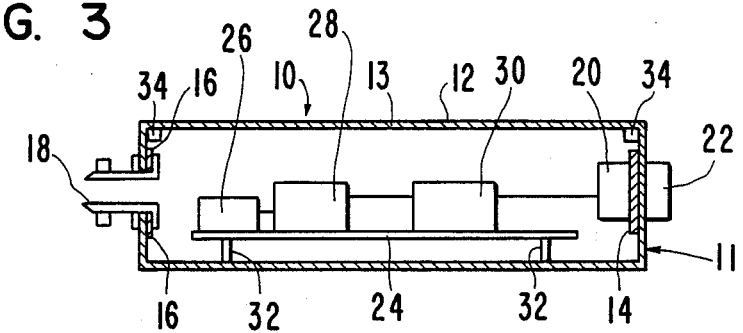
FIG. 3 is a part sectional, part schematic side view of the device of FIG. 1.

A first embodiment of modular line protection device 10 in accordance with the invention is shown in FIGS. 2 and 3. This comprises a two-stage protection circuit 26,28,30 illustrated schematically. The two-stage circuit includes four transient protection devices 26, four delay circuits 28 and four second stage suppression circuits 30 and as such, the modular device 10 is constructed to provide protection for four lines. The two-stage circuits are mounted on a printed circuit board 24, which is itself mounted onto one of the steel sides 12 of a rectangularly cuboidal steel housing 11 by bolts 32. A screen trap input socket 18 is located on the side of the housing 11 approximate to the transient protection devices 26, and a twenty five-way D-type connector output socket 20 is located on the side of the housing opposite the input socket 18. Output shroud part 22 of the D-type connector 20 extends through the steel side of the housing so that a relatively easy connection may be made to the communication destination equipment.

Secured to the internal side wall of the housing in the region of the input socket 18 and output socket 20 is an electromagnetic interference gasket 16 and 14 respectively. The gasket acts so as to enhance the protection provided by the device 10. This embodiment 10 typically has housing dimensions such as length and width 60 mm and height 20 mm. As a result the total length including the sockets 18,20 is approximately 76 mm. Dimensions of this order allow the box-like housing 11 to be placed on a bulkhead, in the same manner as a telephone connecting socket, thereby providing a protection device which is easily connected in signal carrying lines to electronic equipment to provide protection for both the conducted and radiated aspects of an electromagnetic hazard. A plurality of clinch nuts 34 are provided so that one 13 of the sides 12 of the housing 11 is removable and the circuitry 26,28 30 is easily accessed.

Figure 4:
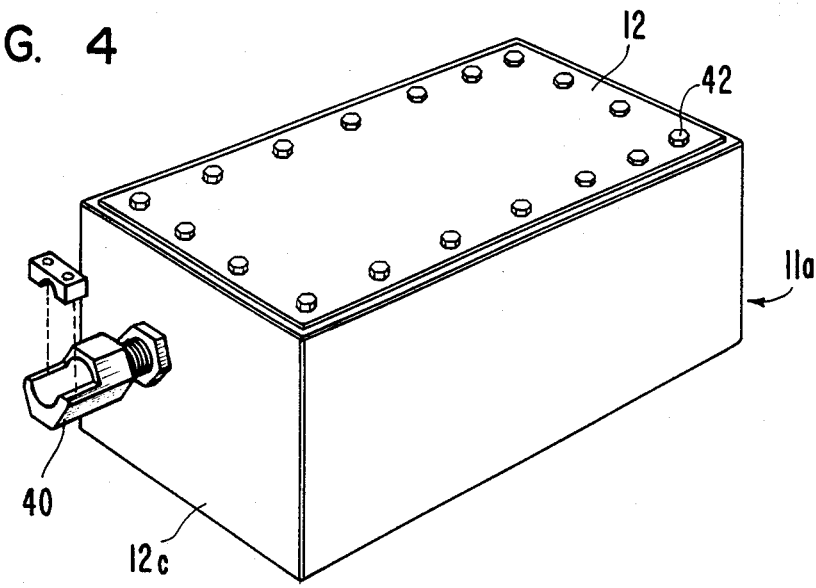
FIGS. 4 and 5 are upper and lower perspective views of a second embodiment of a modular line protection device in accordance with the present invention.
Figure 5:
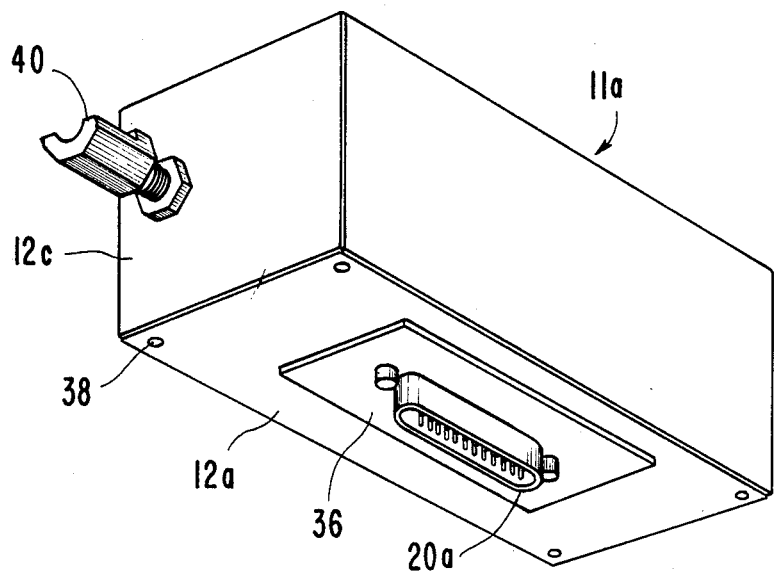

A particularly advantageous form of the invention is illustrated by the embodiment of FIGS. 4 and 5. This is similar in general format and electrical circuitry to the embodiment of FIGS. 2 and 3 but is different in that the D-type output socket 20a is positioned on one of the larger side surfaces or walls 12a of the steel housing 11a. Disposed around the output socket 20a on the outer surface of the side 12a is a rectangular electromagnetic interference gasket 36. As a result of this construction, the steel housing 11a can be mounted directly on the outer wall of an equipment cabinet or enclosure by way of bolts 38, clinch nuts or other suitable means so that the D-type output socket 20a projects through a hole formed in that outer wall of the equipment cabinet, the region around the hole being protected by the electromagnetic interference gasket 36 which is sandwiched and solidly clamped between the side 12a of the housing and the outer wall of the equipment cabinet. An easily releasable connection can then be made to equipment within the cabinet by way of the D-type connector. The front, larger wall 12b of the housing can be removed and is fitted by means of a plurality of bolts 42 or other suitable means, with a further electromagnetic interference gasket located thereBeneath.

The embodiment of FIGS. 2 and 3 can be fitted to an equipment cabinet in the same manner as that of FIGS. 4 and 5, if required.

In the embodiment of FIGS. 4 and 5, the input leads enter by way of a screen trap input socket 40 disposed in the centre of an end face 12c of the housing. The embodiment of FIGS. 6 and 7 is substantially the same as that of FIGS. 4 and 5, one difference being that the screen trap input socket 40a is disposed at a bottom corner of an end face 12d of the housing. FIGS. 6 and 7 show some more detail of the actual positioning of the printed circuit boards and circuitry within the housing. The transient/surge arrestors are shown at 42. The chokes and diodes 44,46 are mounted between two upright circuit boards 48,50, one of which is visible in FIG. 7. The D-type connector 20b is shown in FIG. 7 in dotted lines. Electromagnetic gaskets are disposed at positions 52,54,56 and 58.

Figure 8:
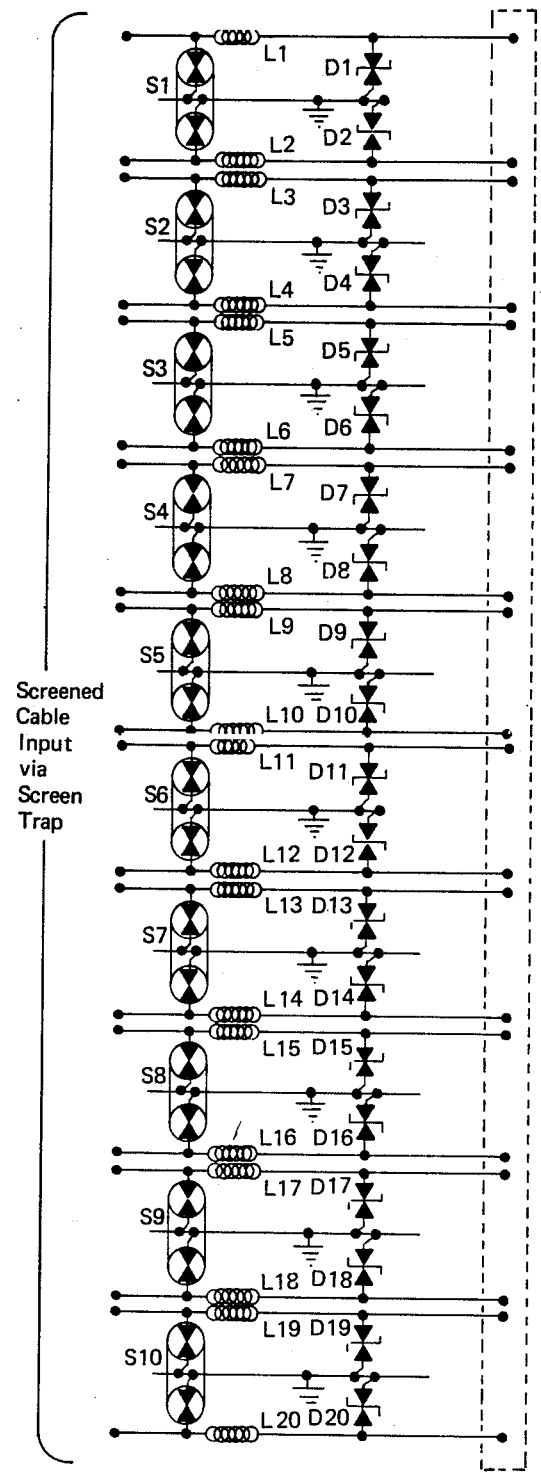
FIG. 8 is an electrical circuit diagram of the embodiments of FIGS. 4 to 7.

The embodiments of FIGS. 4 and 5 and of FIGS. 6 and 7 are designed to protect ten separate signal lines or line pairs. There are thus ten separate sets of line protection circuitry as shown in the circuit diagram of FIG. 8.

Figure 9:
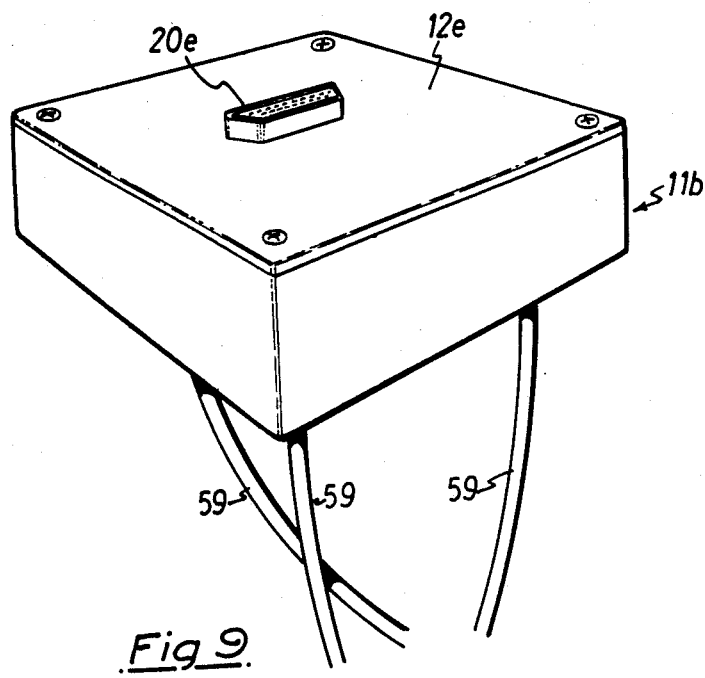
FIGS. 9 and 10 are perspective views of a fourth embodiment.
Figure 10:
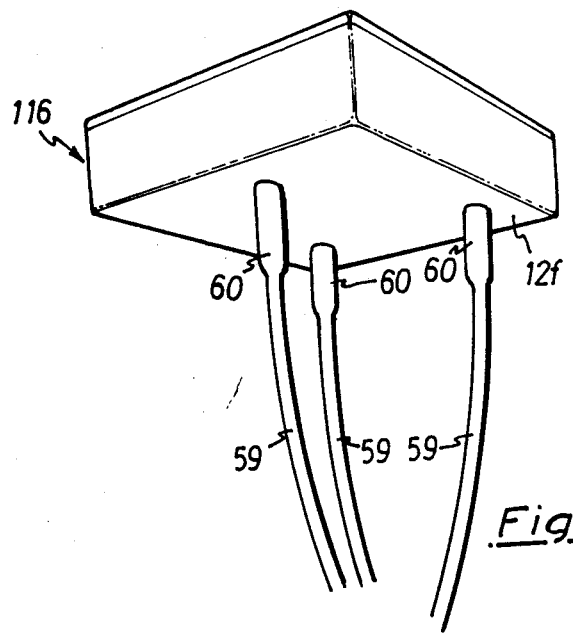

FIGS. 9 and 10 illustrate a further embodiment which is similar in principle to those of FIGS. 4 to 8. One larger side 12e of a square housing 11b carries the D-type output socket 20e. Input signal leads (individual or groups) 59 (three is this instance) enter the housing via the opposite larger side 12f of the housing via screened connections 60. A plurality of such modular housings 11b are mounted on the outer wall 62 of an equipment cabinet 64 as shown in FIGS. 11 and 12, with their D-type output sockets projecting into the cabinet via respective electromagnetically screened holes 66 (FIG. 12). It will be appreciated that this provides an arrangement whereby, for example, faulty or damaged line protection devices can be serviced in situ or removed completely without disturbing other line protection devices and without substantially disturbing the electrical and screened integrity of the equipment cabinet as a whole. Furthermore, it is no longer necessary to provide room for line protection devices within the equipment cabinet itself or to have to provide further bulky cabinets acting as line protection vaults.

The invention is of course not restricted to the details of the illustrated embodiments. Thus, for example, although all illustrated embodiments use conventional D-type connector outputs, other suitable output sockets providing the same essential function can be used. The number of circuits located in any given housing can be selected as appropriate.

I claim:

1. Line protection apparatus which comprises a modular unit including input and output sockets and at least one two-stage protection circuit housed therein within an electromagnetically shielded enclosure to protect against radiated interference, wherein
the output socket of the modular unit comprises at least one multi-way screened connector;
said enclosure comprises a closed metal box;
external electromagnetic gasket means are disposed around said output socket;
the box is adapted to be fitted to an external surface of an equipment cabinet having an aperture therein, such that the output socket of the box extends into the cabinet via said aperture in said external surface, the gasket then lying between the box and said external surface of the cabinet in order to provide electromagnetic shielding around the socket; and
said input and output sockets are located on different sides of said box, with circuit board means carrying said at least one two-stage protection circuit located substantially in between said input and output sockets.

2. Line protection apparatus according to claim 1, wherein the input socket of the modular unit comprises at least one screen trap.

* * * * *